United States Patent [19]

Gladstein et al.

[11] Patent Number: 5,341,503
[45] Date of Patent: Aug. 23, 1994

[54] BATTERY OPERATED COMPUTER HAVING IMPROVED BATTERY GAUGE AND SYSTEM FOR MEASURING BATTERY CHARGE

[75] Inventors: Leo A. Gladstein, Boca Raton, Fla.; Christopher D. Jones, Georgetown, Ky.; Kyriakos Leontiades, Boca Raton, Fla.; Paritosh D. Patel, Deerfield Beach, Fla.; Paul W. Petroskey, Boca Raton, Fla.

[73] Assignee: International Business Machines Corporation, Armonk, N.Y.

[21] Appl. No.: 869,403

[22] Filed: Apr. 16, 1992

[51] Int. Cl.5 .......................... G06F 1/30; G06F 1/32
[52] U.S. Cl. .............................. 395/750; 364/DIG. 1; 364/273.5; 320/14
[58] Field of Search .................. 395/750; 320/14, 39, 320/43, 15, 21; 364/709.11

[56] References Cited

U.S. PATENT DOCUMENTS

| | | | |
|---|---|---|---|
| 3,767,995 | 10/1973 | Kaminski et al. | 320/22 |
| 4,518,961 | 5/1985 | Davis et al. | 340/825.44 |
| 4,583,034 | 4/1986 | Martin | 320/21 |
| 4,593,272 | 6/1986 | Berkowitz | 340/500 |
| 4,611,289 | 9/1986 | Coppola | 364/492 |
| 4,670,703 | 6/1987 | Williams | 320/20 |
| 4,724,528 | 2/1988 | Eaton | 364/715 |
| 4,746,852 | 5/1988 | Martin | 320/20 |
| 4,849,682 | 7/1989 | Bauer et al. | 320/15 |
| 4,866,646 | 9/1989 | Nakamura et al. | 364/709.11 |
| 4,965,738 | 10/1990 | Bauer et al. | 364/483 |
| 4,972,496 | 11/1990 | Sklarew | 382/13 |
| 5,043,651 | 8/1991 | Tamura | 320/43 |
| 5,047,961 | 9/1991 | Simonsen | 364/550 |
| 5,057,383 | 10/1991 | Sokira | 429/92 |
| 5,115,182 | 5/1992 | Ehmke et al. | 320/14 |
| 5,132,610 | 7/1992 | Ying-Chang | 324/142 |
| 5,157,227 | 10/1992 | McDermott et al. | 178/19 |
| 5,157,320 | 10/1992 | Kuriloff | 320/39 |

Primary Examiner—Allen R. MacDonald
Assistant Examiner—Ayaz R. Sheikh
Attorney, Agent, or Firm—George E. Grosser; Douglas R. McKechnie

[57] ABSTRACT

A digitizer tablet computer has a host processor connected to a service processor which, in turn, is connected to a digitizer controller and to a power subsystem microcontroller. A battery supplies the primary power for operating the computer but the computer is also connectable to an external source of DC power to charge the battery and to operate the computer when it is not running on battery power. The service processor includes a battery gauge the contents of which indicate how much power is left in the battery and how much time remains at the current rate of power consumption before the power runs out. The amount of remaining power in the gauge is determined by keeping track of power consumed, power added, and power lost during off periods. The use of the second derivative of a voltage versus time discharge curve creates a point from which relative accurate estimates can be made of how much longer the computer can be operated.

11 Claims, 6 Drawing Sheets

BATTERY OPERATED COMPUTER HAVING IMPROVED BATTERY GAUGE AND SYSTEM FOR MEASURING BATTERY CHARGE

FIELD OF THE INVENTION

This invention relates to the field of portable, battery operated computers. More specifically, the invention relates to improvements in accurately measuring the charge in a battery and maintaining a battery gauge to provide a user with information allowing the user to operate the computer until the battery is nearly depleted and to save data before the battery becomes fully depleted.

RELATED APPLICATIONS

The following applications are related:

(1) Application Ser. No. 07/779,486, filed Oct. 19, 1991, by Alfonso et al, for "PEN BASED COMPUTER".

(2) Application Ser. No. 07/870,124, filed Oct. 16, 1992, by C. D. Jones et al, for "A SYSTEM FOR DISTRIBUTED POWER MANAGEMENT IN PORTABLE COMPUTERS".

(3) Application Ser. No. 07/869,278, filed concurrently herewith, by K. Kannan et al, for "SYSTEM TO SERVICE PROCESSOR INTERFACE FOR A TABLET COMPUTER".

(4) Application Ser. No. 07/869,441, filed concurrently herewith, by L. A. Gladstein et al, for "BATTERY MONITOR AND CELL REVERSAL PROTECTION CIRCUIT".

BACKGROUND OF THE INVENTION

A digitizer tablet computer has been designed which uses a secondary type or rechargeable battery as the primary power source allowing a user to carry the computer about from place to place and conduct different transactions. Thus one of the main objectives of such design was to prolong the useful life of the battery as much as possible by using power management techniques disclosed in the above related application (2), and by accurately measuring the power status of the battery and accurately indicating to the user how much time remains before the battery will be fully depleted. Such indication thereby not only allows the user to save any critical current data but also to use the computer as long as possible before the battery becomes depleted and has to be recharged or replaced.

Within the prior art, there are many examples of devices that keep track of the charge in a rechargeable battery used within different types of devices. U.S. Pat. No. 4,724,528- J. T. Eaton discloses a "BATTERY CHARGE MONITOR IN A COMPUTER SYSTEM" in which a single microprocessor monitors the battery and accumulates both new charge and consumed charged. Such system appears to be a relatively simple low performance system not involving distributed processing and in particular, not involving any digitizer tablet computer.

U.S. Pat. No. 4,965,738- G. W. Bauer et al discloses an "INTELLIGENT BATTERY SYSTEM" in which a battery pack of a plurality of rechargeable cells has integrated into the pack electronic circuitry, including a CPU and memory, for monitoring the charge status of the battery. Battery parameters are stored and accumulated charge and discharge are kept track of by measuring the battery charge and discharge currents.

U.S. Pat. No. 5,047,961-B. P. Simonsen discloses an "AUTOMATIC BATTERY MONITORING SYSTEM" for use with an emergency standby battery. The monitor keeps track of battery conditions and provides a daily printout thereof. The system also includes a CPU and memory and LCD display.

However, none of the above patents, discloses a battery operated digitizer tablet computer having a high performance, distributed processing system in which a service processor controls operation of a power subsystem microcontroller to monitor and charge a rechargeable battery in the manner of the invention, as describe in detail below.

SUMMARY OF THE INVENTION

In accordance with one of the features of the invention, the digitizer tablet uses a pen or stylus that creates a magnetic field which is sensed by a digitizer to provide signals representing the position of the pen. The stylus is used as the primary input device for entering information, including handwriting, into the computer. The analysis of handwriting requires a high precision digitizer which in turn generates a multiplicity of coordinate data and thereby creates a heavy signal processing load. To meet this load, the computer has distributed processing in which the initial handling of digitizer information is off loaded onto a service processor from a main processor. The service processor is also used to control a power subsystem and function as a battery gauge.

In accordance with another feature of the invention, battery conditions are repetitively measured when the computer is on and the latest conditions temporarily stored in a volatile memory. When the computer is shutoff, the computer is powered down in a controlled sequence wherein the latest battery conditions are stored in a non-volatile RAM for use when the computer is restarted. The charge or energy remaining in the battery is determined by keeping track of not only the power consumed when the computer operates from the battery and the charge added when the computer is connected to an external power source, but also to the battery charge lost through self discharge.

In accordance with another feature, the invention accurately predicts, when the battery is near depletion, how much time remains before the computer is automatically shut down with only sufficient charge remaining to power down the computer and save critical data to a non-volatile memory. The general manner in which this is done is to measure battery voltage as a function of time. As the battery nears the end of charge, the battery voltage changes at a variable rate of change which produces a relatively precise measurement for determining the remaining time. By use of the second derivative of voltage versus time, an inflection point is observed which establishes a starting point by which the remaining battery time can be accurately predicted.

The digitizer tablet was also designed to use a nickel-cadmium (nicad) battery as a power source since such type of battery has a number of well known advantages. However, estimating battery charge of a nicad battery is very difficult unless one incorporates a chip within the battery to hold the charge added and removed from the battery over time. Another problem with nicad battery gauges is that when a battery is inserted into the computer, it may or may not be fully charged. If such battery is only partially charged, the user has a very short or no warning between a 'fully charged' indication and a 'no charge' indication and system shutdown. Thus, in accordance with another feature, the invention solves the problems of keeping track of battery charge without a built-in battery chip, and of using a battery that is only partially charge when initially placed in use. For initially partially charged batteries, the battery gauge of the invention is able to accurately predict the amount of time left upon reaching the 'knee' of the battery discharge curve. This allows the user to operate the digitizer tablet confidently knowing that an adequate warning (10 to 20 minutes) will be provided before system power is removed even for initially partially charged batteries.

In accordance with still another feature of the invention, the service processor maintains a battery gauge which provides information indicating what percentage of charge remains in the battery and how much time is left at the current rate of power consumption before the computer shuts down and the battery becomes depleted. The host processor executes programs that read such information from the service processor and control a display so as to present the information to the user in a form determined by the programs executing in the host computer.

DRAWINGS

Other objects and advantages of the invention will be apparent from the following description taken in connection with the accompanying drawings wherein.

Figure 1:
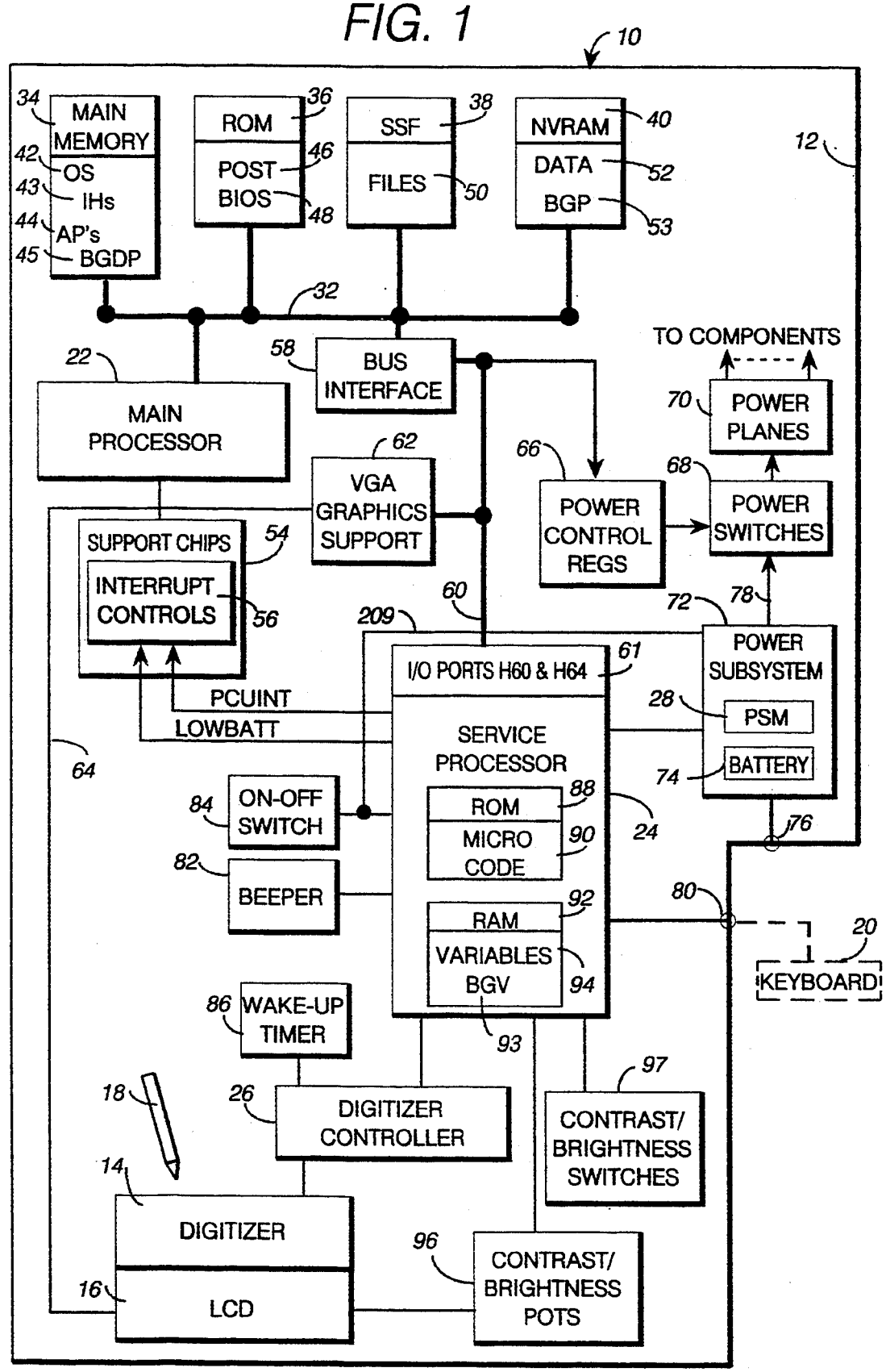
FIG. 1 is a schematic diagram of a digitizer tablet computer embodying the invention.
Figure 4A:
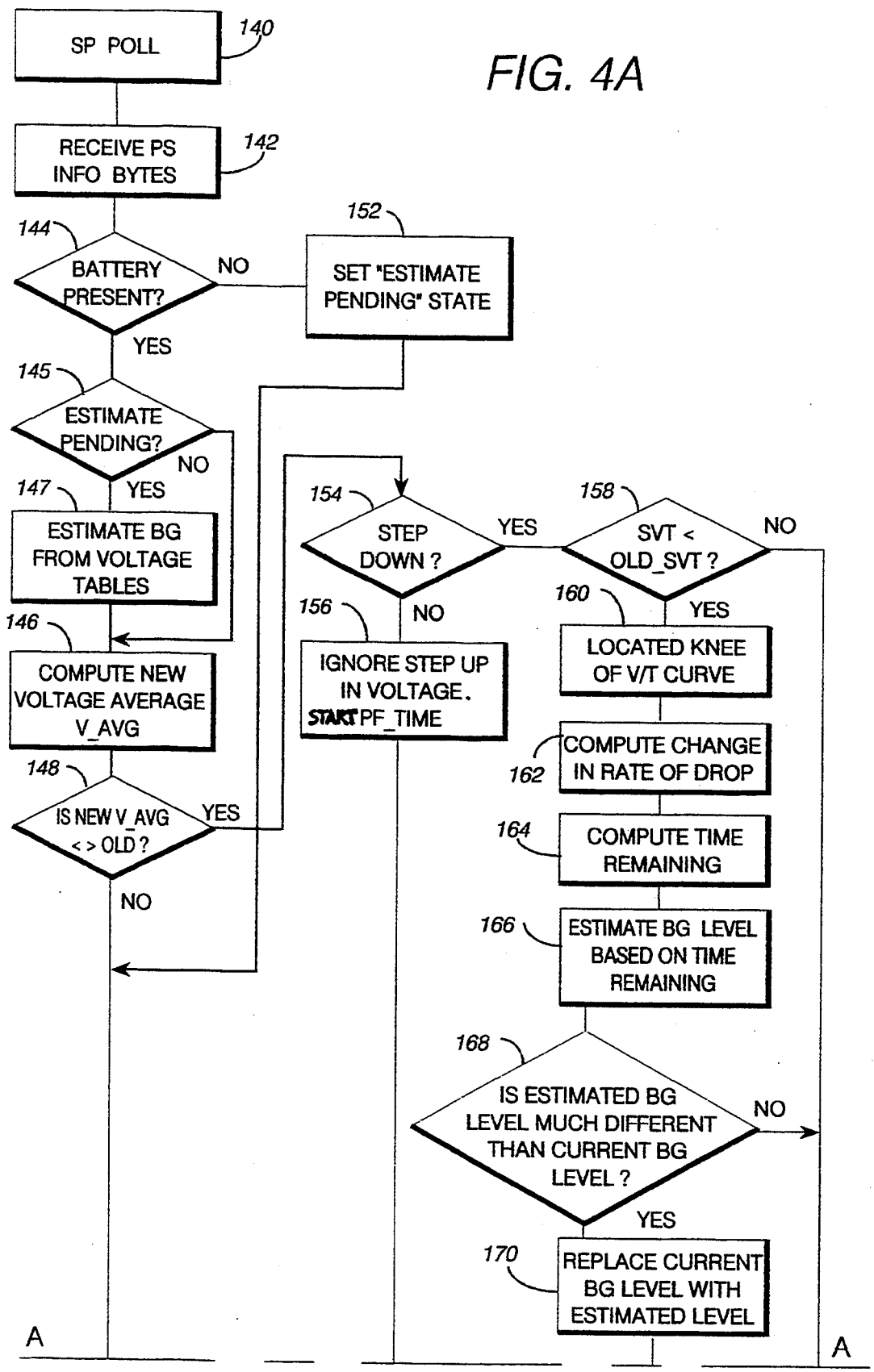
Figure 4B:
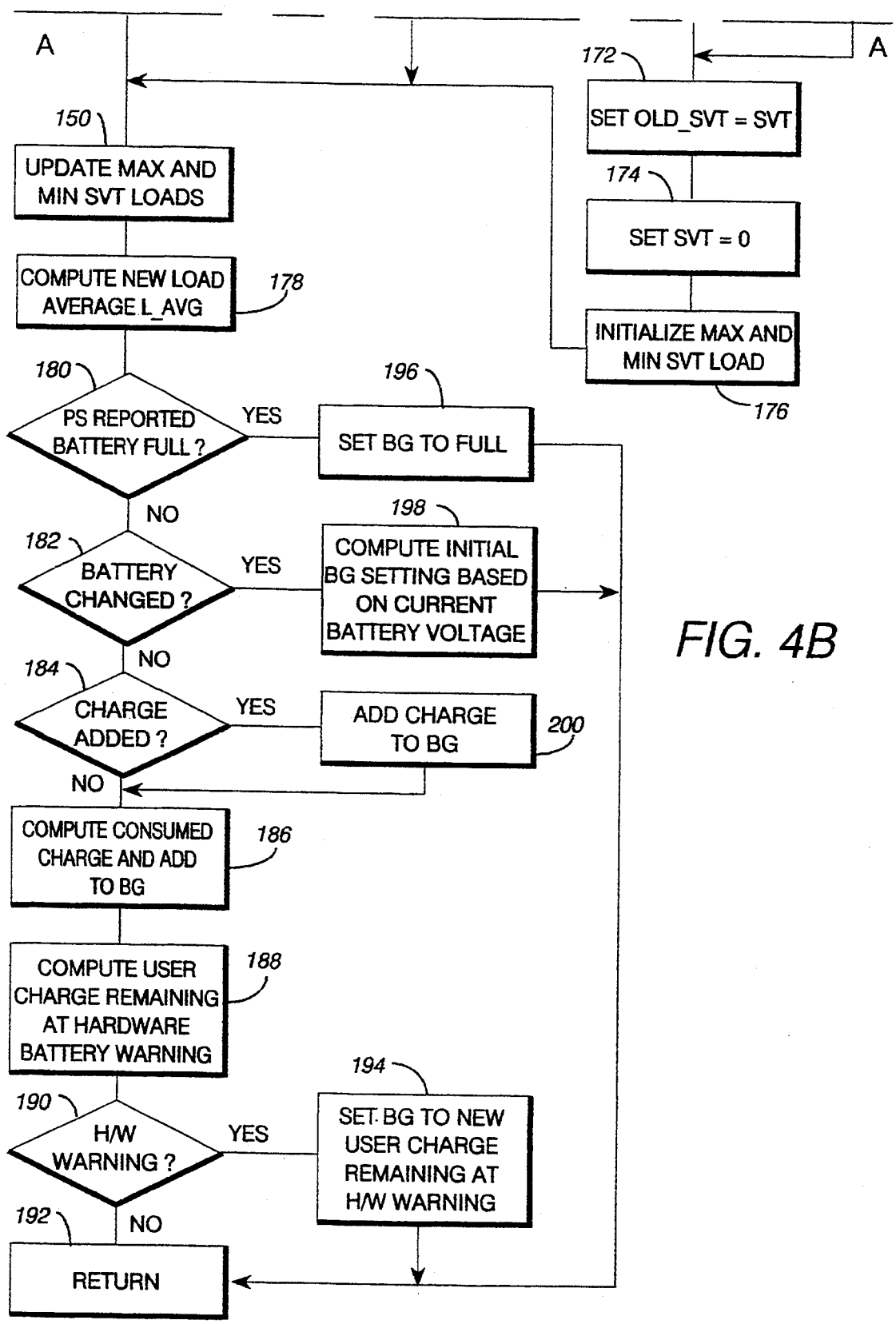
Figure 5:
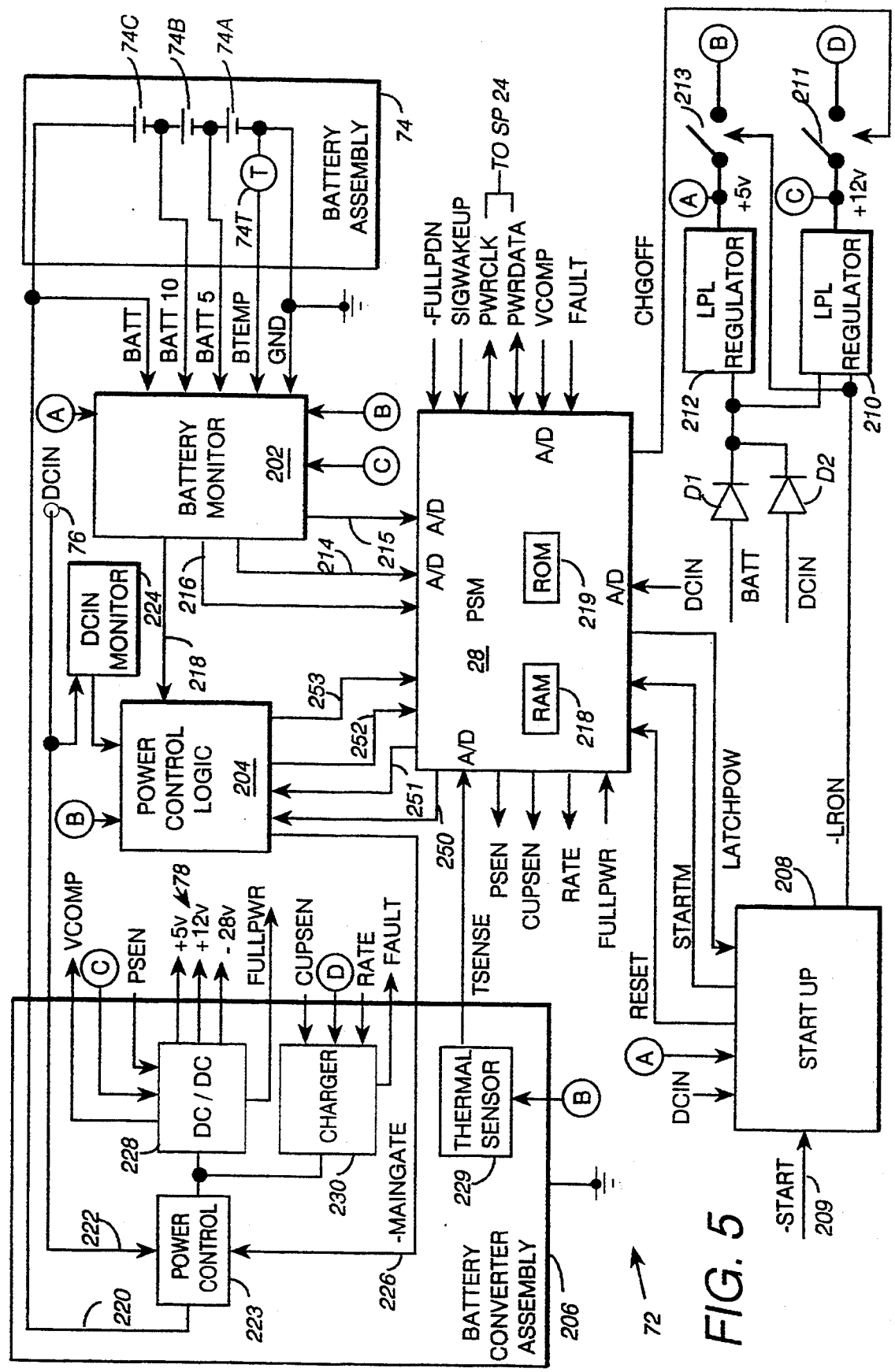
Figure 6:
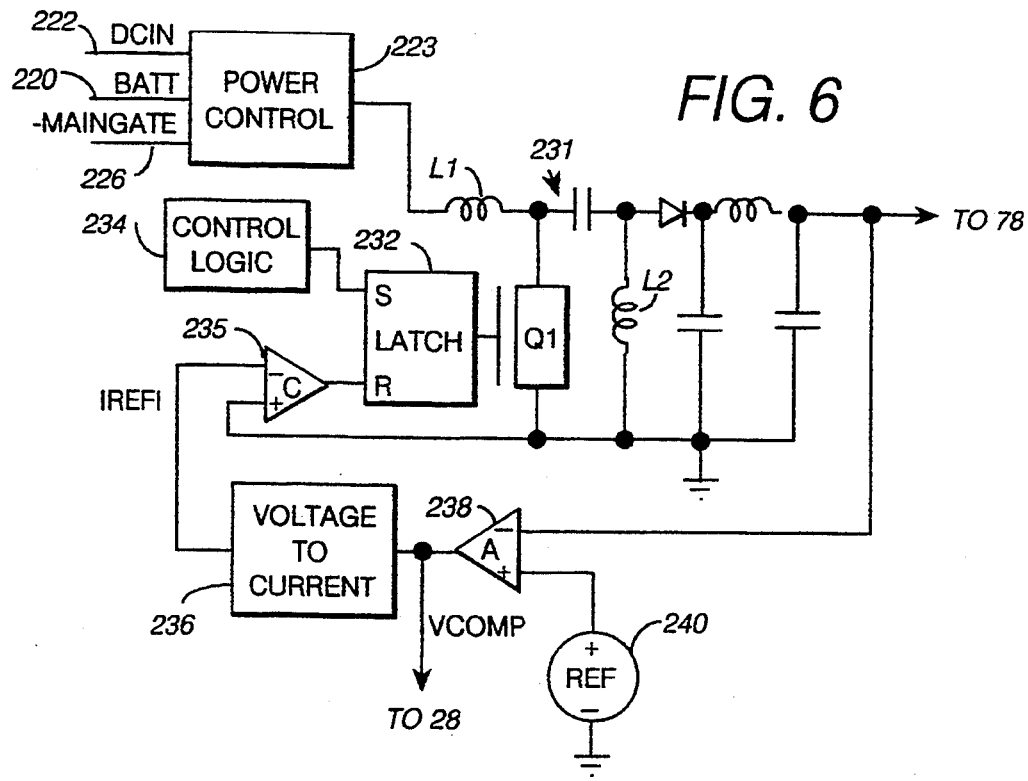
Figure 7:
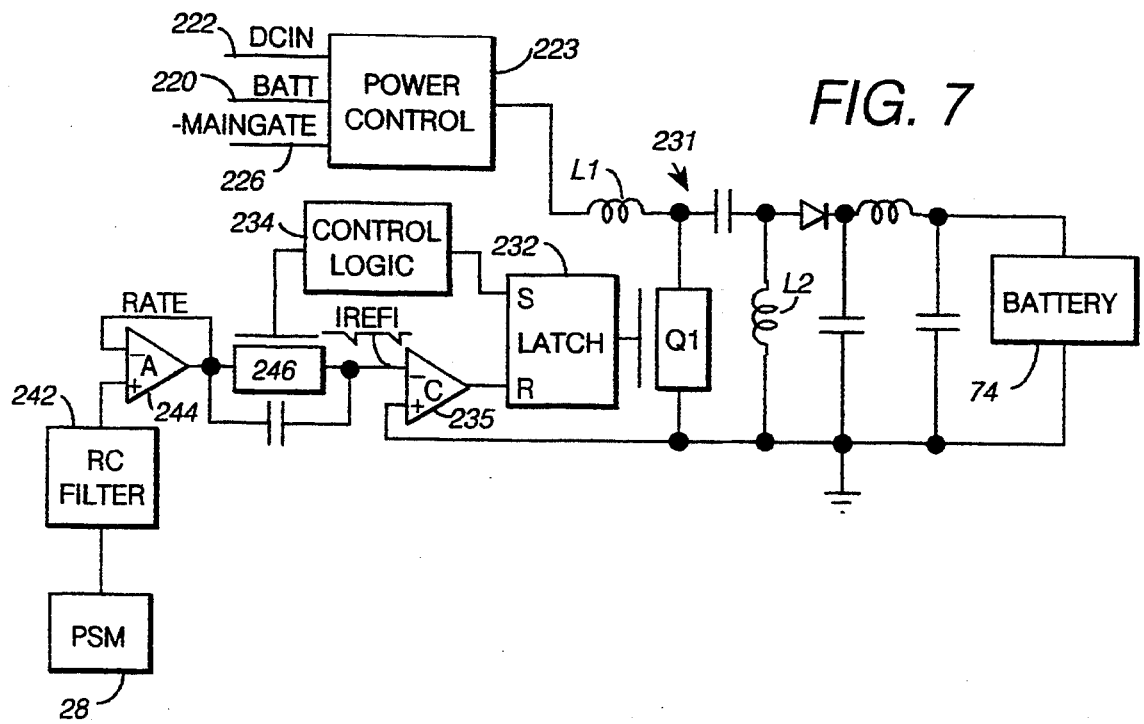

FIGS. 4A and 4B when placed together and joined at reference lines A—A, form a flow chart of the main logic of battery gauge operations;

FIG. 5 is a block diagram showing further details of the power subsystem shown in FIG. 1;

FIG. 6 is a block diagrams illustrating operation of the DC/DC converter shown in FIG. 5; and FIG. 7 is a block diagram illustrating operation of the battery charger shown in FIG. 5.

DETAILED DESCRIPTION

The following description is divided into sections that proceed from a more generalized description of the digitizer tablet computer, through a general description of service processor operations, and finally to specific descriptions of battery gauge and power subsystem control operations.

DIGITIZER TABLET COMPUTER

Referring now to the drawings, and first to FIG. 1, reference numeral 10 denotes a digitizer tablet computer (DTC) that includes a casing 12 for housing the various components of the computer. DTC 10 has a size and a weight that permit a user to readily carry computer 10 from place to place. Housing or casing 12 may have an appearance such as that covered by the above-mentioned related design patent application (1). DTC 10 includes a digitizer 14 mounted beneath a backlighted liquid crystal display (LCD) 16, and a pen or stylus 18, which form the primary input/output means for entering information into and getting information out of the computer. DTC 10 also includes means for connection to other I/O devices for use at locations where it is convenient to do so. For example, an optional keyboard 20 may be used at a home or office location but not out in the field. Computer 10 may also include system I/O (not shown) such as a SCSI diskette port, a parallel port, an RS 232 serial prot, and a data/facsimile modem with an RJ11 connector.

Stylus 18 is the primary input device and is a battery operated, cordless, inkless pen or stylus 18 which includes a movable tip that closes a switch (elements not shown) when brought into contact with the upper surface of the LCD. Stylus 18 generates a magnetic field that is sensed or picked up by digitizer 14 and translated into signals representing X,Y coordinates indicative of pen position or location. The field is weaker when the switch is open and stronger when the switch is closed so the digitizer can distinguish between "proximity" coordinates and "pen down" coordinates. Computer 10 then operates the LCD, in a manner described in more detail hereinafter, to activate pixels close to the pen position so that the user perceives that he or she is actually writing with the pen. As a result of this mode of input, the system may also be referred as a pen computer. Digitizer 14 includes a sensing mechanism (not shown) having a grid of conductive loops. Loop currents are induced by the magnetic field of the stylus and vary dependent upon the stylus position. The currents are analog and converted to digital values and analyzed by digitizer controller 26 which deduces the stylus position based on the distribution of currents in the loops. It sends the stylus coordinates to routine 104 within the SP for further processing and transmission to the host processor.

DTC 10 includes four different programmable digital microprocessors or microcontrollers comprising a host or main processor 22, a service processor (SP) 24, a digitizer controller 26, and a power subsystem microcontroller (PSM) 28, which perform various distributed functions or operations in a manner discussed in more detail hereinafter. Processors 22, 24, 26, and 28 are preferably respectively implemented with the following commercially available modules: an Intel 80386SX microprocessor, a National Semiconductor HPC 46064 high performance microcontroller, a NEC 78C10 microcontroller, and a Signetics 87C752 microcontroller.

Main processor 22 is connected by a local bus 32 to a main memory 34, a read only memory (ROM) 36, a solid state file (SSF) 38, and a non-volatile random access memory (NVRAM) 40. Main memory 34 is implemented as a dynamic random access memory (DRAM), and provides volatile storage of a pen based operating system (OS) 42 and application programs (APs) 44 while such programs are being executed by processor 22. OS 42 includes interrupt handlers (IHs) 43. Aps 44 includes a battery gauge display program (BGDP) 45 that receives battery gauge information and displays it on LCD 16. ROM 36 permanently stores programs such as a power-on self test (POST) program 46 and a basic I/O services (BIOS) 48. SSF 38 operates with low power consumption relative to a hard disk and stores files 50 of the type typically stored on a hard disk. For example, OS 42 and Aps 44 are also stored therein and loaded therefrom into main memory for execution from main memory 34. NVRAM 40 may be implemented in CMOS technology and includes a lithium battery (not shown). Thus the data 52 stored in 40 is not lost when battery 74 is removed or fully discharged. Data 52 includes battery gauge parameters (BGP) 53.

Main processor 22 is also connected to a plurality of commercially available support chips 54 which include interrupt controls 56. While controls 56 handle other interrupts commonly directed to processor 22 (the details not being germane to the invention), controls 56 receive two interrupts related to the invention in a manner described in more detail hereinafter. The interrupts are PCUINT and LOWBATT which are transmitted to controls 56 from service processor 24. PCUINT is generated when the SP detects an on/off button actuation, or a high temperature condition, or a change in power source (e.g, addition or removal of external power source), or a charge or battery fault. LOWBATT is generated when SP 24 detects a low battery condition.

Local bus 32 is connected through a buffer or bus interface 58 to a bus 60 which is connected to I/O ports 61 in service processor 24, to VGA graphics support 62 and to power control registers (REGS) 66. Such busses and buffer connect the main processor to such elements whereby the main processor controls the operation of LCD 16 and the distribution of power through the settings of regs 66, and operates service processor 24 as a slave device. VGA graphics support 62 is connected by line 64 to LCD 16. The various screens presented on LCD 16, including the "writing" produced by stylus 18, are thus controlled by the main processor.

A power distribution system includes power control regs 66 that are connected to and control the opening and closing of power switches 68 which receive power over bus 78 from a power subsystem (PS) 72 and selectively deliver such power to power planes 70. The various components of the system are respectively connected to different ones of planes 70. PS 72 includes PSM 28 and a rechargeable, nickel/cadmium battery 74. PS 72 is also connected to a connector 76 for receiving an adapter (not shown) that provides DC power from an external source for charging the battery and operating the computer. When an adapter is plugged into connector 76 and is connected to an external power source, DTC 10 operates under external power and battery 74 is charged as needed. Power control regs 66 are connected to bus 60 and are addressable so that host processor 22 can selectively set the registers to control or turn switches 68 on and off and execute power up and power down sequences for power management operations.

SERVICE PROCESSOR

Service processor 24 is connected to a connector 80 which allows a keyboard 20 to be optionally attached to computer 10 and operated under the control of the service processor. Processor 24 is also connected to a speaker or beeper 82, an on/off switch 84, and up and down brightness and contrast switches 97. Beeper 82 operates under the control of processor 24 and produces an alarm sound indicating when the charge in battery 74 is low. Switch 84 is user operated and provides the means for selectively turning computer 10 on and off and causing different events to occur dependent upon the power states and status of the computer. Computer 10 has four power states, namely, normal power, idle power, sleep power and zero power states. The action of switch 84 is part of the power management facility incorporated into computer 10 to extend the battery time of operation of computer 10. Such facility is described in more detail in the above mentioned related application (2) and operates in such fashion that clock rates may be changed and the entire system put into a sleep state when inactive to conserve power, and various sections of the logic and I/O devices may be powered off when not in use.

Service processor 24 includes a ROM 88 for storing microcode 90 and a RAM 92 for storing variables 94, including battery gauge variables (BGV) 93, which are generated and used while the microcode routines are executed by processor 24. Also connected to processor 24 are potentiometers or pots 96 and switches 97 for controlling the brightness and contrast of LCD 16 under the control of user operated contrast and brightness switches 97.

SP 24 controls keyboard 20, digitizer 14, system buttons comprising switch 84 and pots 96, and power subsystem 72. SP 24 interfaces with the host processor over bus 60 via a standard keyboard controller interface modified to support the digitizer and power subsystem but not supporting a mouse. SP 24 interfaces with keyboard 20 over a standard keyboard interface, with digitizer 16 over an interrupt driven serial interface, and with power subsystem 72 over a polled serial interface similar to the keyboard interface. Main processor 22 offloads to SP 24 much of the I/O intensive processing needed to manage the keyboard, digitizer and power subsystem interfaces. SP 24 also assists the host processor with power management and supervises the system while the main processor is sleeping.

Figure 2:
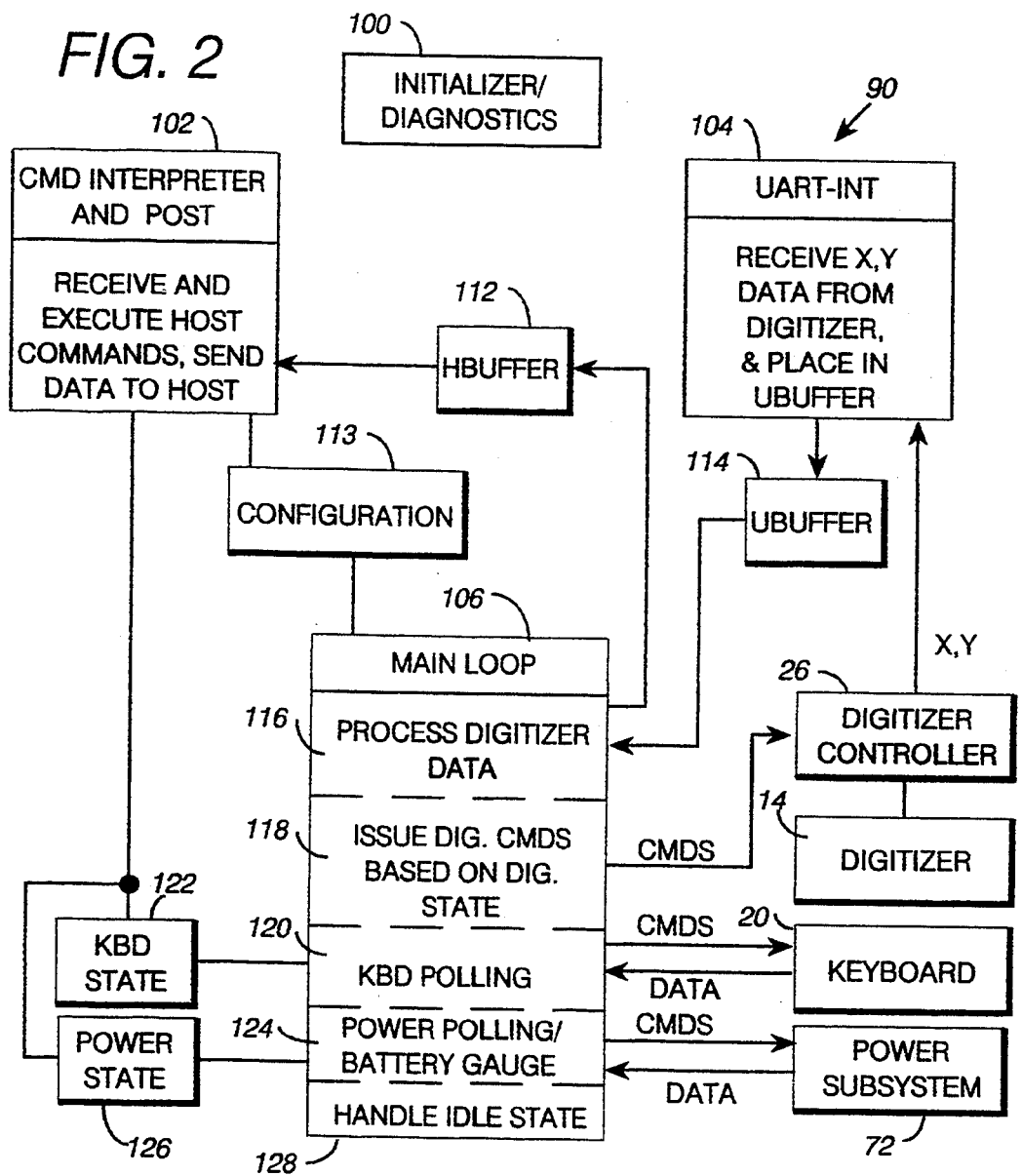
FIG. 2 is a schematic diagram illustrating interaction between hardware and microcode routines in the service processor shown in FIG. 1.

FIG. 2 illustrates service processor routines defined by microcode 90 and related hardware that implement the main logic of the battery gauge. The routines are illustrated in boxes having uniform line widths, while the hardware is illustrated in shadowed boxes. Such routines include an initializer and diagnostics routine 100, a command interpreter and post routine 102, a UART-interrupt (INT) handler 104, and a main loop routine 106. The general operation of the various routines will now be described. Initializer and diagnostic routine 100 is performed when the computer is initially turned on from a zero power state. The routine initializes various components and performs power-on diagnostics. Upon successful completion thereof, DTC 10 is set to its normal power state where full operations can proceed. Routine 102 receives, interprets and executes host commands, handles host data that must be sent to the keyboard, and transmits or posts data between the SP and the host. Such data includes digitizer data from HBUFFER 112, configuration data from configuration register 113, and keyboard and power state data from registers 122 and 126.

UART-INT routine 104 receives information (X,Y coordinates or command responses) from digitizer controller 26 and stores them in UBUFFER 114 for later processing by a process digitizer data routine 116 in main loop 106. Main loop routine 106 performs background processing and loops through a series of routines 116, 118, 120, 124, and 128. Routine 116 formats and filters the digitizer coordinates and places the results in HBUFFER 112 for transmission to the host computer. Routine 118 issues various digitizer commands based on the state of the digitizer and commands from the host. Routine 128 does any state transition processing required to switch between states when entering and exiting idle mode. Routine 120 is a keyboard polling loop that monitors a keyboard interface clock (not shown) and receives keyboard data including scan codes and command response data. Lastly, routine 124 is a power polling loop that monitors a power interface clock (not shown) and receives power subsystem data over a serial link, such data including power packets described in detail below. Routine 124 is executed approximately every ¼ of a second and transfers or clocks in data using a power clock generated by PSM 28. Routine 124 also functions as part of the battery gauge that indicates how much energy remains in battery 74 and how much time remains until the battery charge is depleted. Further details of the battery gauge operation are described below.

SP 24 stores in RAM 92 the following variables and flags. All time units are 2 seconds. Thus, a value of 5 for a time variable means 10 seconds. Charge (energy) units are Watt 2 seconds unless otherwise stated. Thus, a value of 5 for a charge variable means 10 Watt seconds.

"v_avg"—Battery voltage averaged over 10 seconds. It represents the average battery voltage over the previous 10 seconds. Its units are 0.117 Volts. Thus, a value of 145 represents 17 Volts. Such unit corresponds to the resolution for measuring battery voltage. "same_v_T" or "svt"—This counter counts the amount of time that the battery voltage stays at the same value. The counter is incremented every 2 seconds. It is initialized to zero when v_avg changes. It is used to measure the rate of drop of battery voltage and to compute time remaining when the discharge curve reaches the knee area. In essence, the voltage vs. time discharge curve, as seen by the SP, appears as a descending staircase, and svt measures the width of the steps, which is the time the voltage stays at the same step or voltage level. The current rate of change of the battery voltage is $(0.117) \times 2/svt$ Volts/sec ($\times 2$ because svt is in units of 2 sec).

"old_svt"—Time in previous same Voltage step. Its units are 2 sec. It is used to calculate the change in the rate of voltage drop (second derivative of voltage with respect to time). The change in the rate of voltage drop along with the present rate (svt) is used to calculate the time remaining in the battery once the knee of the battery discharge curve is reached. This change in the rate is represented by R=svt/old_svt. This is the fraction of time that voltage remains at the current level relative to the fraction of time it remained at the previous level. The time remaining TR is the sum of the series [(svt,R1)+(svt,R2)+ . . . +(svt*Rn)], where  denotes exponentiation and n is the number of voltage steps between the current voltage Cv and the battery warning voltage Wv. (See FIG. 3).

"min_svt_load"—Minimum load during the current svt step.

"max_svt_load"—Maximum load during the current svt step.

"max_svt"—Current maximum same voltage time. This is a measure of the slope of the discharge curve at the inflection point. It gives an indication of initial battery charge. If max_svt is below 65, SP 24 issues a low battery warning upon detecting battery warning issued by the PSM (PS battery warning).

"knee_done" flag—Set to 1 if 'knee of the curve' correction was done at least once.

"l_avg"—Battery load averaged over 10 seconds. It represents the average over the previous 10 seconds. Units are 0.148 Watts. Thus a value of 80 represents a load of 11.8 Watts.

"wc"—Warning charge. This is the charge left in the battery when the first battery warning is issued by the power subsystem. Units are Watt-minutes.

"save_charge"—Charge needed by the host to save system state. Units are Watt-minutes. This determines when SP issues a warning to the host after receiving a PS battery warning. SP delays issuing the host warning to stretch battery life.

"pf_time"—Power Fluctuation timer. Its value is 0 if the last power fluctuation did not occur recently. Every time SP senses a significant (more than 6% on l_avg) power fluctuation it initializes this counter to 1 minute and starts counting it down. While this counter is non-zero 'knee of the curve' estimates of time remaining are not done since they depend on voltage levels and power fluctuations disrupt the rate of drop of battery voltage.

"fc1"—Percent of nominal full charge in a full battery. Default is 94%. Nominal full charge is 38880 Watt 2 seconds (corresponding to 21.6 Watt Hours).

"fc2"—Percent of nominal full charge for an optional half battery. Default is 45%.

"cc"—Consumed charge, unadjusted. To adjust, multiply by "cf" and divide by 100. Its units are Watt 2 Seconds.

"ac"—Added charge. Its units are Watt 2 Seconds.

"cf"—Consumed charge factor. Initialized to 100 and stays at 100 unless modified by the host. The host may modify this charge factor along with fc1 and fc2 to adjust battery gauge 93 operation for aging batteries or for new higher or lower capacity batteries.

It should be noted that the variables "fc1", "ac", and "cc" are principal battery gauge variables 93 from which the charge remaining in the battery at any given time can be calculated as (fc1×38880+ac−cc). The percentage of charge remaining can be calculated as the (charge remaining×100/nominal charge) where the nominal charge equals 38880.

Host processor 22 uses a number of commands to read the battery gauge information from the service processor for display to the user and to save and restore battery gauge parameters 53 to and from system NVRAM. Following is a description of these commands. Only some of the parameters of these commands are used for battery gauge operation.

xB000 Read Power State

"power_state" is a variable where SP keeps the reason for a PCUINT or LOWBATT interrupt as well as a flag that tells the system whether the battery is present. When SP receives this command, it returns power_state to the host (port x60) so the host can determine the reason for a LOWBATT or PCU interrupt event. The information in power_state is relevant only following a PCUINT except for the 'no battery' bit.

More than one condition may be reported in the power_state byte as follows:

Bits 0-1 Battery Condition

00—Battery normal, or external source is connected.

10—Low battery Warning. (Bit 0=0, Bit 1=1).

Before setting this value, the SP asserts the LOWBATT signal which causes a host interrupt. The host can determine the reason for the interrupt by issuing xB000. SP will beep the speaker on/off at a steady rate while LOWBATT is asserted until the host asserts FULLPDN, at which time SP will go to its idle state. Before going to its idle state, SP continues to process normally keyboard data, digitizer data and host commands.

Normally, after receiving a low battery warning the system will ignore user input, save immediately the user's data to the Solid State File (SSF), and go to the system's sleep state (FULLPDN active). SP's periodic beeping is a signal to the user that this automatic data saving is taking place, and the user should not attempt to remove the battery (e.g. to replace it with a fully charged spare). The user may choose to connect an external source at this time, at which point SP will stop beeping. Pressing the ON/OFF switch at this point will also stop the beeping and turn the system off (except for the power LED), but the system will continue saving the user's data to the SSF under the covers. After the system activates FULLPDN, SP stops beeping and goes to its idle state.

01—Battery not OK or Dead. (Bit 0=1, Bit 1=0). This value is set by SP after it detects a dead battery. It is a signal to the system that there is probably no time to save user data. SP will beep the speaker periodically like in the low battery case. Unless an external source is connected within a few seconds, system machine state is lost.

SP reports 'Dead Battery' on three occasions:
1: At power up, if SP's dead battery test indicates a dying battery.
2. During normal operation, if the power subsystem reports 'Battery not OK'.
3. During normal operation, if the user disconnects the external source and the SP discovers that the battery is close to dying. SP treats disconnection of an external source just like power up for dead battery detection.

In all cases above, SP asserts LOWBATT, which causes a system interrupt.

11—Testing for dead battery. SP sets this value while it is testing for dead battery. This happens at power up and also immediately after external power is removed. The default battery testing time is 20 seconds.

The remaining bits 2–7 may be used for purposes not related to the invention and are omitted for sake of simplicity.

xB00A Read % battery charge left.

In response to receiving this command, SP 24 calculates the amount of battery charge left or remaining in accordance with the calculation described above. SP 24 then returns to the host processor 22 a byte representing the % battery energy remaining. A value of xFF means that SP is in the process of estimating battery charge from battery voltage for a newly inserted battery. It takes approximately 20 seconds (equal to dead battery test time), after removing the external source, to produce an initial battery charge estimate for a newly inserted battery.

SP maintains BGV 93 to keep track of remaining battery energy. SP polls the Power Subsystem (PS) periodically and keeps track of system energy consumption as well as energy additions to the battery by an external source. It also keeps track of battery removal and insertion and uses the system NVRAM to store PS parameters BGP 53. The PS parameters represent the state of the battery when the system is turned off. These include charge added to the battery by the built-in charger, charge consumed by the system, etc.

On power up the system power on code must give the PS parameters to SP so that SP can maintain the battery gauge. Commands xBB40 to xBB5F are used by the system to read and save the PS parameters in NVRAM at system power down. Commands xBB60 to xBB7F are used by the system to send to SP the PS parameters at system power up for storage in RAM 92 as part of BGV 93 (FIG. 1).

If the system does not pass the PS parameters at power up, or if a new battery is inserted, the SP attempts to guess at the charge state of the battery by reading the battery voltage. This method does not produce a reliable charge estimate because the battery discharge curve (voltage versus time) is fairly flat over a wide time interval. In addition, the level of the voltage of equally charged batteries varies from battery to battery. Note that the user must disconnect the external source before reading the battery gauge for a newly changed battery and wait for about 20 seconds until the dead battery test completes.

If SP must guess at the battery charge from battery voltage, it will bias its guess toward a fully charged battery. Therefore, unless the user inserts a fully charged battery, the battery gauge reading will be too high until the discharge curve reaches the knee, at which point SP switches to a different algorithm that uses the rate of voltage drop to estimate remaining charge. To avoid this, the user should fully charge a new battery of uncertain charge status using the built-in charger or an external charger.

If the user uses the internal charger to charge a newly inserted battery that is discharged or partially charged and then removes the external source before fully charging the battery, the battery gauge reading will indicate 'full charge'.

If the user inserts fully charged full cell batteries and/or fully charges full cell batteries using the built-in charger and an external power source, the battery gauge is expected to be accurate within 1% to 10% of full charge on the average. Most of the inaccuracies are expected to result from battery variations, such as battery aging.

New NiCad batteries must undergo 2 to 3 full charge-full discharge cycles before the internal power subsystem charger can charge them to rated capacity (21.6 Watt-hours for a full cell battery). Since there is no way for SP to know that a battery is new or old, the battery gauge readings during the initial charge-discharge cycles will not be very accurate.

xB00B Read battery charge time remaining.

In response to receiving this command, SP 24 calculates the time remaining before the battery warning interrupt occurs assuming that future operations will occur at the current power level. SP 24 then returns two bytes representing the number of seconds of operation remaining at current power level. The low order byte is returned first followed by the high order byte. Resolution is two seconds.

A value of xFFFF means that SP is in the process of estimating battery charge from battery voltage for a newly inserted battery and no estimate of time remaining is available.

The time remaining will vary depending on the momentary power consumption of the system which is measured by the power subsystem load detection circuit. For example, if the backlight is on and the system is writing to the solid state file at the time of the battery gauge computation, the time remaining will be considerably less than if the backlight was off and there was no SSF writing. Due to noise and quantization error in the load detection circuit, the reading may vary by as much as 1 minute (+/−30 seconds) for the same actual system load.

When an external source is present and charging the battery the load value available to SP includes the load used to charge the battery. Therefore, 'time remaining' will be considerably less than when the external source is removed. To get an accurate time reading the user must first disconnect the external source and wait a few seconds. The % charged reading however will be accurate (again, provided the user uses initially fully charged batteries).

XBB40-XBB5F Read PS parameters bytes x00 to x1F.

SP will return the Power Subsystem parameter byte requested: x40 corresponds to parameter byte 0, x41 to byte 1, etc. SP uses these to implement dead battery detection, over temperature sensing, and the battery gauge. SP will use internal defaults if the system does not pass the parameters at power up. However internal defaults may result in incorrect battery gauge operation. There are two types of PS parameters stored by the system processor: constant and variable. Constant parameters are x00 through x0F. Variable parameters are x10 to x1F.

Constant PS parameters are not modified by SP. Their value is determined by the system. Ordinarily the system only needs to write constant parameters at power up. The system must pass these parameters to SP at power up immediately following the self test command (xAA). Constant PS parameters are parameters such as the high temperature battery warning limit, dead battery test parameters, the energy capacity of the battery, etc. SP has internal defaults for all of these parameters and it uses these defaults if the system does not pass these parameters to SP at power up or if the values passed are zero. By allowing the system to change these parameters, flexibility is gained. For example, a new higher capacity battery may be introduced without having to update the SP microcode.

Variable PS parameters are parameters or variables whose value may be modified by SP during its operation. Ordinarily the system will read variable parameters from SP at power down and write them to SP at power up. These must be kept in the system NVRAM and passed to SP at power up immediately following the self test command (XAA). The system must read and save these variables to NVRAM immediately before powering down. Examples of variable PS parameters are consumed charge, added charge, battery warning voltage, etc. Some of them, such as the battery warning voltage, are parameters for which SP has internal defaults, so SP can operate even if the system does not pass them to SP at power up; SP may modify these parameters during its operation to better reflect actual machine hardware; for example the battery warning voltage may vary from its nominal (default) value from machine to machine; SP can figure this out and determine the actual battery warning voltage for a particular machine. Others, such as consumed charge, are variables and unless the system passes them to SP at power up and saves them at power down, some SP operations, such as battery gauge operations, will not work correctly.

Default values below are decimal unless preceded by 'x'. Constant PS parameter bytes are:

x00—A/D value of high ambient temperature warning limit. Default is 23 corresponding to 60 degrees C.

x01—A/D value of high battery temperature warning limit. Default is 34 corresponding to 42 degrees C.

x02—Dead battery test time in units of 250 msec. Default is 80 corresponding to about 20 seconds.

x03—Options flag. This allows the host to set various options for battery gauge operation.
  Bits 0–3 Reserved.
  Bit 4 Half cell. When set to 1 it tells SP to assume that the battery is a half cell battery. Default is 0 (full cell batteries).
  Bit 5 Reserved.
  Bit 6 Activate knee code. Set to 1 activates SP code that detects the knee of the discharge curve and uses the rate of change of the voltage drop to predict the time of battery depletion. Default is 1.
  Bit 7 Voltage table. Set to 0 to use voltage tables weighted towards fully charged batteries. Set to 1 to use tables weighted towards partially charged batteries. Default is 0.
  Based on the above the default value of this byte is 2.

x04—First voltage limit. If the battery voltage drops below this during the dead battery test, the battery is declared dead unconditionally. Default is 147.

x05—Warning charge. This is the charge left in the battery when the PS battery warning is asserted in units of Watt-minutes. Default is 50.

x06—Save charge. This is the charge needed by the host to save the system state before system power off in units of Watt-minutes. The system state needs to be saved so the system will continue upon power on where it left off at power off. Default is 28.

x07—reserved.

x08—Full battery factor. % of nominal full battery charge seen by user from battery full to battery warning. Default is 94.

x09—Half battery factor. % of nominal full battery charge seen by user from battery full to battery warning. Default is 45.

x0A–x0F reserved

Variable PS parameter bytes are:

x10—Consumed charge low. This is the low order byte of consumed charge in units of two Watt-seconds. Consumed charge is the cumulative battery energy consumed by the system. Default is 0.

x11—Consumed charge high. This is the high order byte of consumed charge in units of two Watt-seconds. Default is 0.

x12—Added charge low. This is the low order byte of added charge in units of two Watt-seconds. Added charge is the cumulative energy added to the battery when an external source is connected. Default is 0.

x13—Added charge high. This is the high order byte of added charge in units of two Watt-seconds. Default is 0.

x14—Voltage warning. The A/D value representing the battery voltage at the time the power subsystem generates a low battery warning as detected by SP. Default is 146.

x15—Percent estimate. Initial percent estimate of this battery. Default is 0.

x16—Net consumed charge low. Low byte of the net consumed charge Default is 0.

x17—Net consumed charge high. High byte of the net consumed charge. Default is 0.

x18—Consumed charge factor. % factor to adjust consumed charge. Default is 100.

x19—PS flags. This is a byte of flags with the following meaning:

Bits 0-6—Reserved, used by SP. Defaults are 0.

Bit 7—NVRAM initialized. If the host sets this bit, it means that the variable PS parameters have been initialized to their defaults. The system must set this bit if the variable PS parameters it writes to SP at power up are not the same as the parameters that the system read and stored in NVRAM during the last power down; this may occur, for example, if the system CMOS backup battery is removed. In this event the host must transmit default values for the PS parameters. After the host sends this bit to SP, SP clears it so the next time host reads and saves it, it will be zero.

This is the only modification to the variable PS parameters done by the host.

x1A—Self-discharge charge low. Low byte of the battery self-discharge charge. The host must compute this parameter by multiplying the number of hours elapsed since the last power down by 17. At power down SP returns zero when the host reads it. The power down hours are determined from a non-volatile system timer.

x1B—Self-discharge charge high. High byte of the battery self-discharge charge.

x1C-x1F reserved.

Parameter 0 is read by XBB40, 1 by xBB41, and so on. The host may read parameters in any order. However, it must write parameters in sequence from low to high (see below). For reserved parameters SP returns zero.

xBB60PP-xBB7FPP Write PS parameters x00 to x1F.

PP is a byte representing the value of the corresponding parameter. SP will store this value internally and use it in its dead battery detection, over temperature control, or the battery gauge algorithms. SP will use internal defaults if the system does not pass a particular parameter at power up or passes a 0. See XBB40 to XBB5F for parameter definitions.

The host must send these commands immediately following the self test command (XAA), within 2 seconds of system power up. The commands must be sequenced XBB60PP, xBB61PP,..., xBB79PP. The host may either skip reserved parameters or send any value for them; SP will ignore values for reserved parameters. Reception of command xBB7BPP is a signal to the SP that it can start power subsystem operations, since all necessary parameters have been received. This is necessary because these parameters are essential for correct power subsystem initialization and control. If the host sends these commands at a time other than immediately following XAA, the battery gauge may not operate correctly.

BATTERY GAUGE OPERATIONS

Battery gauge functions are distributed throughout DTC 10. The gauge is implemented primarily in SP 24 with major involvement of PSM 28 and minor involvement of host processor 22. After system power is applied, the host processor sends to the SP the parameters (BGP 53) necessary to operate the battery gauge. These parameters include the net charge (energy content) of the battery as saved in NVRAM 40 during the last system power down. One of the parameters is the self-discharge charge computed in the host processor by multiplying the number of power down hours by the battery self-discharge rate per hour. Using these parameters SP 24 calculates the current state of battery charge (provided the battery has not changed while the machine was off). PSM 28 can detect if the battery was changed while the system is off and notifies SP 24 of such an event. SP 24 then begins polling PSM 28 and starts receiving periodic (every quarter second) reports of voltage and load from the PSM.

Figure 3:
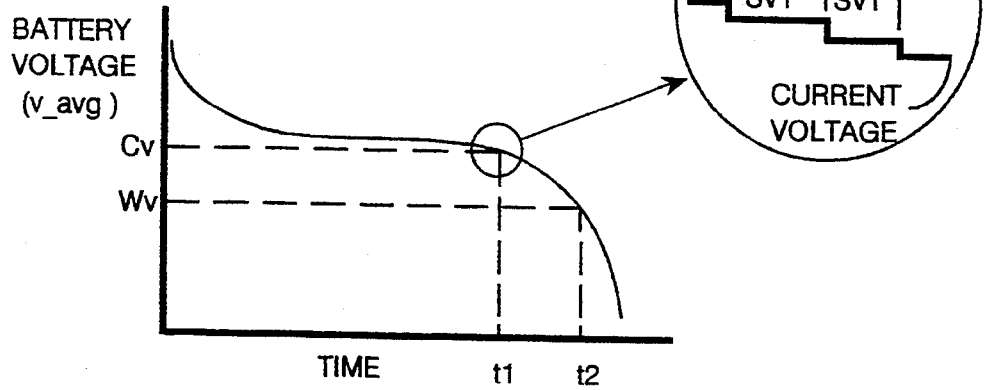
FIG. 3 is a graph of battery voltage versus time, which graph is useful in defining terms used to describe certain aspects of the invention.

FIG. 3 illustrates the general shape of a nicad discharge curve plotting average voltage "v_avg" against time of discharge. "Cv" represents the current voltage, i.e., the latest level to be measured at time t1. In the enlarged insert, the voltage curve is a series of steps of varying time plotted against a voltage decrease of a fixed amount corresponding to the measurement interval or resolution of v_avg. The "old_svt" is the time between t4 and t3 during which the voltage was constant. The "svt" is the time interval in the step immediately following the old_svt when the voltage is also constant or remains at the same value between t5 and t4. The "knee" of the curve occurs when the voltage starts to drop relatively rapidly before the battery becomes depleted and occurs roughly in the region between times t1 and t2. In the knee, the second derivative of the curve yields an inflection point that provides an accurate point for estimating or determining the time remaining between such point and when the warning voltage will be reached and the computer shut down.

As previously indicated, SP 24 periodically polls PS 72 as part of routine 124 (FIG. 2) and performs the operations illustrated in FIGS. 4A and 4B to which reference will now be made. SP 24 polls power subsystem (PS) 72 in step 140 in response to which SP 24 receives from PS 72 in step 142 PS data or information in the form of a data packet. The polling occurs repetitively about every 250 milliseconds. Each data packet is eight bytes long. In response to the first poll after system power up, the data packet contains the following information:

"Battery changed while the machine was off"—PSM 28 operates normally while the machine is off, provided there is an external source present. While the machine is off, the battery may be charged. If the PSM senses that the battery has been removed, it remembers this event and notifies the SP at the first opportunity (i.e. during the next power on). If there is no external source, but the battery is present, the PSM goes to its 'halt' state. In this state the contents of a RAM in the PSM are preserved and a special 'signature' area in the RAM is set up with distinct pattern that remains intact as long as there is battery power. If the battery is removed, (and there is no external source), the signature pattern is destroyed, so when power is applied next and the PSM goes through its power on procedure it can determine that 'power was disrupted', i.e. the machine went through a state when no power was present. Thus, PSM 28 determines that the battery was replaced while the machine was off, and transmits this information to the SP at power up.

"Cumulative charge added to the battery while the machine was off"—PSM 28 controls a charger that charges the battery if an external source is present. PSM 28 accumulates added charge and transmits this charge to SP 24 at the first opportunity. If charging occurs while the machine is off, the charge added is given to SP in the first transmission from PS to SP. Charging can also occur while the machine is on and an external source is present. In this case, charge added is reported to SP as part of the periodic information transmission from PS to SP.

While computer 10 is on, the PSM sends periodic information packets to SP. Each packet contains the following information relevant to the battery gauge:

"Battery voltage"—The PSM measures battery voltage, converts the measurement to a digital value using an 8 bit on board A/D converter and transmits this value to the SP. The resolution of the voltage measurement is about 0.117 mV.

"Battery load"—The PSM measures battery load, converts the measurement to a digital value using an 8 bit on board A/D converter and transmits this value to the SP. The resolution of the load measurement is about 0.15 Watts.

"PS flags"—The PSM notifies the SP that it fully charged the battery by setting a 'Battery fully charged' flag.

"Added Charge"—The PSM measures battery charge added while charging the battery. It transmits this measurement to SP. The resolution of the added charge is about 2 Watt-seconds.

After step 142, step 144 determines if a battery is present. If none is present, step 152 prepares to estimate the battery gauge level by setting a "estimate pending" state and then skips to step 150. If a battery is present, step 145 then checks to see if there is an estimate pending. If one is pending, step 147 then estimates the battery gauge level from voltage tables. If no estimate is pending, and upon completion of step 147, step 146 then computes a new voltage average "v_avg" from the voltage received in the data packet. Step 148 then determines if the new voltage is different from the old one. If not, step 150 will then be performed. If step 148 determines the new or most recently calculated "v_avg" is different from the old one, step 154 then determines if the new voltages is less than or a step down from the old one. If it is not, and therefore must be a step up, step 156 branches to step 150 and thereby ignores a step up in voltage. If the step is down, step 158 determines if the "svt" is less than the "old_svt" and if it is, step 160 initially sets a flag indicating that the knee of the voltage versus time curve has been located and thereafter merely skips to the next step. Step 162 computes the change in the rate of drop and step 164 computes the time remaining before reaching the battery warning voltage level using the formulas discussed above.

Step 166 then estimates the battery gauge level based on time remaining and step 168 determines if the battery estimated battery gauge level is much different from the current gauge level. If it differs by more than 25%, step 170 then replaces the current battery gauge level with the estimated battery gauge level. The purpose of steps 166, 168 and 170 is to correct for any inaccuracy that might result from connecting a battery into the system which is not fully charged. During the course of using up the first partial charge, the reaching of the knee allows an accurate resetting of the remaining charge so that such level can then be accurately maintained thereafter through subsequent charge and discharge cycles of operation.

Following negative determinations from steps 158 or 168 or completion of step 170, step 172 replaces the "old_svt" with the latest "svt" and step 174 resets the current "svt" to zero to commence another timing interval. Step 176 initializes the maximum and minimum "svt loads" for the current interval by setting them both to the current load. Next, step 150 updates the maximum and minimum "svt loads" for the current svt period by comparing the old values with the current load. Step 178 then computes a new load average. Using the flag in the data packet, step 180 decides if the power subsystem reported the battery has a full charge. If so, step 196 sets the battery gauge level "full" and branches to return step 192.

If the battery is reported as not being full, i.e., the battery full flag is not set, step 182 determines from the packets information initially provided if the battery was changed. If so, step 198 computes the initial battery gauge setting based on current battery voltage and sets the gauge accordingly before returning via 192. Step 198 is performed only at power up and thereafter it would be bypassed so step 184 would follow step 180. If the battery was not changed and on subsequent passes through the illustrated routine, step 184 determines if any charge was added. On the initial pass, this would include charge added while the computer was off. On subsequent passes, this would include charge added while connected to an external power source. If charge was added either way, step 200 adds the value to the level in the battery gauge. After either of steps 184 or 200, step 186 computes the charge consumed every ten seconds. The charge consumed and added charge are combined to determine the level of the battery gauge. It should be noted that when the voltage v-avg remains constant, the battery gauge level is determined every ten seconds in accordance with the charge consumed during such period. When the knee of the curve has been reached or located in step 160 and thereafter, the battery gauge level is adjusted every time there is a voltage drop by the steps following 160. Thus, there are two ways that the battery gauge level is determined once the knee has been reached.

Step 188 computes user charge remaining at hardware battery warning. The battery warning is generated by the battery monitor as described in detail in the above related application (4), and occurs when the battery voltage falls below a predetermined value. When the battery warning occurs, the battery warning bit is set in the power status byte that is periodically sent by the PSM to SP 24. Step 190 determines if there has been a hardware battery warning. If there was none, step 192 returns. If there was a warning, step 194 sets the battery gauge to the new user charge computed in step 188.

POWER SUBSYSTEM

The following bytes are used by the PS processor for battery gauge support:

DCHGCNTL Low byte of a two byte variable representing the amount of charge added to the existing battery. The two bytes are transmitted to the SP when possible and cleared after the transmission. Units for this data is in Watt-2 Sec.

DCHGCNTH High byte of charge added to the existing battery.

DCHGRATE This byte represents the amount of charge being added every 2 seconds to the existing battery. The units for this byte is Watts-2 Sec. This byte is added to the accumulated charge (DCHGCNTL, DCHGCNTH) every 2 seconds. It is also considered to be the "Fill Rate" and is changed whenever the PS charges at a different rate.

Flags—The following flags are used by the PS processor for battery gauge support:

IWCHANGED—This flag is set whenever the PS detects that the battery has been removed and gets cleared when transmitted to the SP.

IWFILLED—This flag is set whenever the PS detects that the battery has been completely filled and is cleared when transmitted to the SP.

When a battery of unknown charge level is placed in DTC 10, the PSM begins charging the battery and declares that the battery has been filled when the battery temperature rises by more than 1.5 degrees over a three minute period or the battery voltage exceeds 28 VDC or more than 36 Watt hours of energy has gone into the battery.

Referring to FIG. 5, power subsystem 72 includes PSM 28 and battery 74 as previously described. PS 72 further includes a battery monitor 202, power control logic 204, a battery converter assembly 206, and start-up control 208. When the on-off switch 84 (FIG. 1) is pressed by a user, a-START signal is fed on line 209 to start up 208 which generates two signals STARTM and -LRON. STARTM is produced whenever switch 84 is pressed by a user and a power source (battery or external) is present. -LRON is produced when switch 84 is pressed or when an external power source (DCIN) is introduced or when a fresh battery is placed in computer 10. -LRON generates a RESET signal that is fed to PSM 28 and monitor 202. PSM 28 generates a LATCHPOW signal that is fed back to start up 208 so that -LRON continues to be active after switch 84 is released. -LRON is also transmitted from 208 to a low power linear (LPL) regulator 210 and provides a control signal to a switch 213 connected to the output of LPL regulator 212. DCIN and BATT signals are fed respectively to two diodes D1 and D@ whose outputs are both connected to regulators 210 and 212. These regulators produce a 12 volt signal which is fed to switch 211 and to converter 228 through connector 12S. Switch 211 is controlled by a CHGOFF signal from PSM 28 to shut the charger off. Switch 211 when switch 211 is closed transmits the output of regulator 210 to charger 230 through connectors C. The output of regulator 212 is transmitted directly to switch 213 and to monitor 202 through connector B. Switch 213 is connected to sensor 229 through connector A to supply power thereto.

Battery 74 comprises fifteen nicad cells connected in series. Two center taps divide the cells into three groups 74A, 74B, and 74C of five cells each, the taps being connected to monitor 202 and thereby providing the monitor with voltages BATT5 from group 74A, and BATT10 from group 74B. In addition, a ground signal GND and a voltage signal BATT from group 74C are fed into monitor 202. Also, battery 74 includes a thermistor 74T the resistance of which is proportional to battery temperature. Battery monitor 202 monitors the three banks or groups of five battery cells for two purposes: extended use of battery energy, and cell reversal protection in a manner discussed in more detail in the above related application (4). Monitor 202 is connected to PSM 28 by two lines 214 and 216 and transmits on such lines signals representing the battery voltage and battery temperature. The battery temperature is obtained by measuring the resistance of thermistor 74T and converting it to a corresponding temperature value. Such signals are inputted into PSM 28 through analog-to-digital (A/D) ports and stored in RAM 218. Monitor also generates a battery warning signal WARNNOT when the monitor detects that a bank has dropped below 5.50 volts DC, and transmits such signal to PSM 28 on line 216. Such signal interrupts PSM 28 which then informs the service processor. Monitor 202 also generates an emergency shutoff signal -EM signal when the voltage from any battery bank 74 A, B, or C drops below 5.0 volts DC. Such signal is transmitted to power control logic 204 and to PSM 28 on line 218 causing the battery to be disconnected from the converter.

Battery converter assembly 206 includes a power control 223, a DC/DC converter 228, and a battery charger 230. Control 223 is connected to battery 74 via line 220 and to external power source connector 76 via line 222 and selects which power source will operate the computer. When the connector 76 is connected to an external power source, DCIN power is supplied. A monitor 224 detects the availability of the external power and transmits a signal to logic 204 which, in response to receiving such signal, generates a signal MAINGATE on line 226 causing control 223 to connect converter 228 to the external power source. When the external power source is not present, control 223 operatively connects converter 228 to the battery.

Converter 228 supplies +5 volts, +12 volts and −28 volts on lines 78. It also outputs a signal FULLPWR when the converter is putting out full power to the computer, which signal is inputted into PSM 28 for monitoring such condition. Converter 228 also outputs an analog load signal VCOMP that is fed into an A/D port of PSM 28 for determining the power load being used or consumed in the system. Converter 228 is turned on and off by a signal PSEN from PSM 28. Converter 228 will be shut down due to an overcurrent or an overvoltage condition on line +5, or a short circuit on the +12 volt line. A thermal sensor 229 protects against overthermal condition during operation of converter 223 and inputs a temperature signal TSENSE to PSM 28 for monitoring such condition.

PSM 28 is connected to power control logic 204 through lines 250-252 for respectively transmitting therebetween a WAKE signal, a power on PCON signal, and an EXTSRC signal indicating connection to an external source. PSM 28 also receives a FAULT signal from charger 230 when a charging fault occurs. PSM 28 also receives power management signals-FULLPDN and SIGWAKEUP. The -FULLPDN indicates that the computer is going into a suspend state and will be drawing low power, such signal being used by the PSM to enter its low power state. The SIGWAKEUP signal is used to awaken the PSM from a sleep state to allow communication to occur. The PWRCLK and PWRDATA signals are clock and data signals which are sent to SP 24.

Converter 228 uses circuits similar to those described in U.S. Pat. No. 4,902,957- J. C. Cassani et al. With reference to FIG. 6, an integrated control 231 is used by both converter 228 and charger 230. Its use by the converter is illustrated in FIG. 6 and its use by the charger is illustrated in FIG. 7. Control 231 includes a power device Q1 that is a field effect transistor switched on and off by a signal from a latch 232. Control logic 234 and a comparator 235 respectively control the setting and resetting of latch 232.

When power device Q1 is turned on, input current through an inductor L1 and output current through an inductor L2 flow through the device. L1 and L2 are parts of an LC filtering network. Device Q1 is switched off when the current into comparator 235 equals a reference current Irefi. Irefi current is generated by use of an error amplifier, 238 and voltage to current converter 236. A signal VCOMP programs the peak current found in power switch Q1 and thus forms a signal for determining the load in each measurement interval when the system is operating from the battery. The signal VCOMP is connected to the an A/D channel in the PSM controller. The relationship between battery power and VCOMP for various battery voltages is stored in the system and is used to determine the average power delivered by the battery and to adjust the remaining fuel level accordingly.

When an external power source is connected, charger 230 is turned on or controlled by an enabling signal CUPSEN. Charging occurs when the computer is turned either on or off and the battery is not fully charged. Charger 230 is connected to the battery by line 220 and supplies power to charge the battery through such line. PSM 28

PSM 28 uses the hardware shown in FIG. 7 for charging battery 74. The core of the design uses DC/DC converter circuits found in U.S. Pat. No. 4,902,957. However, instead of configuring the power converter to produce constant output voltage by means of error amplifier 238 and reference voltage, the device is configured to be a variable output voltage converter with fixed power device current. This is required because the NiCD battery voltage is not constant as it is being charged.

When power device Q1 is turned on, input current through L1 and output current through L2 flow through device Q1. The device is switched off when the current into comparator 235 equals the reference current Irefi. Irefi is generated by adding a sawtooth voltage to the RATE signal. The RATE signal is controlled by PSM 28. A software controllable PWM signal is filtered with an RC filter 242 and then buffered by op amp 244.

For fixed DCIN voltages, the current into the battery is a function of the battery voltage and RATE voltage. The relationship is shown in fig. The PS microcontroller monitors battery voltage, system power requirements, battery temperature, and ambient temperature and adjusts the RATE signal every 2 seconds during charge. During each such interval, the RATE signal is directly proportional to charge added and the PSM accordingly bases the charge added information that is sent to SP 24 in the data packets on the RATE signal. The PSM also adjusts a FILL RATE byte according to the amount of charge current going into the battery.

The following tables dictate the charge rate and fill rate:

| Battery Charge Power: | |
|---|---|
| 0 < DC/DC Power Out < 1 Watt | High current charging available |
| 1 < DC/DC Power Out < 5 Watt | Medium current charging available |
| 5 < DC/DC Power Out | Pulsed trickle charge available |

| Battery Charge Power: | |
|---|---|
| Ambient Temp < 10° | No charging allowed |
| 10 < Ambient Temp < 45° | Charge not limited by Ambient temp |
| 45 < Ambient Temp < 50° | Max charge limited to pulsed trickle |
| 50 < Ambient Temp | No charging allowed |
| Battery Temp < 10° | No charging allowed |
| 10 < Battery Temp < 40° | Charge not limited by battery temp |
| 40 < Battery Temp < 45° | Max charge limited to pulsed trickle |
| 45 < Battery Temp | No charging allowed |

The following tables indicate charge characteristics for the three rates. Column (A) is battery voltage in volts DC, (B) is minimum current in amperes, (C) is maximum current in amperes, (D) is average current into battery in amperes, (E) is average power into battery in watts, and (F) is fill rate in watts-2 sec.

| (A) | (B) | (C) | (D) | (E) | (F) |
|---|---|---|---|---|---|
| Pulsed Trickle Charge: | | | | | |
| 15 to 18 VDC | 0.56 | 0.72 | 0.075 | 10.72 | 1 |
| 18 to 21 VDC | 0.60 | 0.70 | 0.075 | 12.67 | 1 |
| 21 to 24 VDC | 0.46 | 0.58 | 0.075 | 12.15 | 1 |
| 24 to 27 VDC | 0.40 | 0.40 | 0.075 | 11.22 | 1 |
| 27 to 30 VDC | 0.35 | 0.41 | 0.075 | 11.00 | 1 |
| Medium Current Charge: | | | | | |
| 15 to 18 VDC | 0.56 | 0.72 | 0.65 | 10.72 | 6 |
| 18 to 21 VDC | 0.60 | 0.70 | 0.65 | 12.67 | 6 |
| 21 to 24 VDC | 0.46 | 0.58 | 0.54 | 12.15 | 5 |
| 24 to 27 VDC | 0.40 | 0.40 | 0.43 | 11.22 | 4 |
| 27 to 30 VDC | 0.35 | 0.41 | 0.38 | 11.00 | 3 |
| High Current Charge: | | | | | |
| 15 to 18 VDC | 0.70 | 0.88 | 0.80 | 13.20 | 7 |
| 18 to 21 VDC | 0.72 | 0.86 | 0.80 | 15.60 | 7 |
| 21 to 24 VDC | 0.70 | 0.86 | 0.80 | 18.00 | 7 |
| 24 to 27 VDC | 0.63 | 0.70 | 0.66 | 17.00 | 6 |
| 27 to 30 VDC | 0.50 | 0.63 | 0.56 | 15.90 | 5 |

It should be apparent to those skilled in the art that many changes can be made in the details and arrangements of steps and parts without departing from the scope of the invention as defined in the appended claims.

What is claimed is:

1. In a portable, battery operated, tablet computer, the combination comprising:
   a video system including a display;
   a digitizing subsystem comprising
      a digitizer physically coupled to said display,
      a stylus operated by a user and being movable between different locations relative to said digitizer and said display for writing on said digitizer to enter user information into said computer, and
      a digitizer controller connected to said digitizer for converting positions of said stylus, as it writes on said digitizer, into digital coordinates indicative of stylus position;
   a selectively actuated control switch for turning said computer on and off;
   a power subsystem including a connector adapted to selectively connect said computer to an external source of electrical energy, a battery for supplying electrical energy to operate said computer, a converter connected to said battery and to said connector for supplying voltages to power said computer from said battery or the external source dependent upon whether said connector is connected to or disconnected from the external source, said converter including means for generating a load signal indicating how much charge from said battery is being consumed by said computer when said computer is turned on and being powered by said battery, a charger connected to said battery and said connector for charging said battery when said connector is connected to the external source, said charger being selectively operable in response to a control signal to add an amount of charge to said battery from an external source in proportion to said control signal, and a power subsystem microcontroller (PSM) connected to said converter for periodically reading said load signal and determining how much charge has been consumed, said PSM being further connected to said charger and operative to generate said control signal, transmit said control signal to said charger and determine from said control signal how much charge has been added to said battery during a charging interval, said PSM being further operative to periodically form packets of information and include in each packet an indication of such added charge and an indication of said amount of consumed charge;

a service processor connected to said PSM and including a memory for storing battery information indicating how much charge said battery contains, said service processor being operative to periodically poll said PSM and receive said packets of information therefrom, said service processor being further operative to update said battery information in accordance with charge added and consumed as indicated by each of said packets;

a host processor connected to said display and to said service processor, said host processor being operative to read said battery information from said service processor and selectively display battery information on said display;

said service processor being further connected to said digitizer controller for receiving said coordinates from said digitizer controller, processing said coordinates to produce coordinate information, and transmitting said coordinate information to said host processor; and said host processor being operative, in response to receiving said coordinate information from said service processor, to analyze said coordinate information and to operate said display and visually output to the user said user information written on said digitizer by said stylus.

2. A computer in accordance with claim 1 wherein said battery information displayed includes relative charge remaining in said battery and/or time remaining until said battery charge becomes depleted.

3. A computer in accordance with claim 1 wherein: said service processor periodically polls said PSM to receive said packets of information;

said digitizer controller interrupts said service processor to transmit said coordinates to said service processor;

and said service processor interrupts said host processor to send said coordinate information to said host processor.

4. A computer in accordance with claim 1 wherein: said service processor communicates with said host processor as a slave device for executing commands from said host processor, said commands including at least one for reading said battery information from said service processor.

5. A computer in accordance with claim 1 wherein: said commands include one for reading an indication of the amount of time remaining before said battery charge becomes depleted;

and said service processor is operative in response to receiving such one command to calculate such amount of time and send an indication thereof to said host processor.

6. A computer in accordance with claim 5 wherein said service processor calculates such amount of time in accordance with rate of change of voltage drop and a number of voltage drop intervals of a fixed size remaining between current battery voltage and a predetermined warning voltage level.

7. A computer in accordance with claim 1 comprising:

a non-volatile memory (NVM);

and power management means connected to said NVM and to said service processor for reading said battery information from said service processor and storing it in said NVM when said computer is powered down and for reading said battery information from said NVM and storing it in said service processor when said computer is powered up whereby said service processor can accurately maintain said battery information until said battery is removed from said computer.

8. A computer in accordance with claim 1 comprising:

means in said PSM for indicating removal of said battery, and transmitting an indication of such removal to said service processor when said computer is powered up.

9. A computer in accordance with claim 8 comprising:

means in said host processor for measuring the length of time that said computer is powered down and calculating an amount of charge consumed during such time by battery self discharge;

and means in said host processor for transmitting such amount of charge to said service processor when said computer is powered up to adjust said battery information in accordance with the charge consumed through self discharge.

10. A computer in accordance with claim 1 comprising:

a battery monitor connected to said battery and said PSM for measuring battery voltage and generating a voltage signal;

said PSM being operative to include a voltage value in each of said packets representing said battery voltage;

said service processor being further operative to determine a average voltage "v_avg" from said voltage values received in packets during a predetermined interval and to determine lengths of time periods during which such "v_avg" remains constant.

11. A computer in accordance with claim 10 wherein said service processor comprises:
first means for determining the amount of charge consumed during each time period in which said "v_avg" is constant and adjusting said battery information;
and second means responsive to a drop in said "v_avg" for comparing rate of voltage change and adjusting said battery information in accordance with an estimate of operating time to reach a predetermined warning level.

* * * * *